United States Patent
Ren et al.

(10) Patent No.: US 10,438,849 B2
(45) Date of Patent: Oct. 8, 2019

(54) MICROWAVE ANNEAL TO IMPROVE CVD METAL GAP-FILL AND THROUGHPUT

(71) Applicant: APPLIED MATERIALS, INC., Santa Clara, CA (US)

(72) Inventors: He Ren, San Jose, CA (US); Jie Zhou, San Jose, CA (US); Guannan Chen, Sunnyvale, CA (US); Michael W. Stowell, Loveland, CO (US); Bencherki Mebarki, Santa Clara, CA (US); Mehul Naik, San Jose, CA (US); Srinivas D. Nemani, Sunnyvale, CA (US); Nikolaos Bekiaris, Campbell, CA (US); Zhiyuan Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/137,245

(22) Filed: Apr. 25, 2016

(65) Prior Publication Data

US 2017/0309515 A1 Oct. 26, 2017

(51) Int. Cl.
*H01L 21/768* (2006.01)
*H01L 21/285* (2006.01)
*H01L 23/532* (2006.01)

(52) U.S. Cl.
CPC .. *H01L 21/76883* (2013.01); *H01L 21/28556* (2013.01); *H01L 21/76877* (2013.01); *H01L 23/53209* (2013.01)

(58) Field of Classification Search
None
See application file for complete search history.

(56) References Cited

U.S. PATENT DOCUMENTS

| | | | | |
|---|---|---|---|---|
| 6,426,293 | B1 * | 7/2002 | Wang | H01L 21/2885 205/157 |
| 2007/0246830 | A1 * | 10/2007 | Shimooka | H01L 23/53238 257/758 |
| 2009/0206484 | A1 * | 8/2009 | Baker-O'Neal | H01L 21/76873 257/751 |
| 2013/0045595 | A1 * | 2/2013 | Cheng | H01L 21/76883 438/661 |
| 2013/0260555 | A1 * | 10/2013 | Zope | H01L 21/4846 438/660 |
| 2014/0038431 | A1 * | 2/2014 | Stowell | H01L 21/324 438/795 |
| 2014/0305934 | A1 * | 10/2014 | DeCamillis | H05B 6/686 219/709 |
| 2014/0327139 | A1 * | 11/2014 | Yu | H01L 23/5226 257/751 |
| 2015/0179579 | A1 * | 6/2015 | Jezewski | H01L 21/76846 257/753 |
| 2015/0348962 | A1 * | 12/2015 | Chao | H01L 23/5283 257/207 |
| 2016/0130699 | A1 * | 5/2016 | Gatineau | C23C 16/45525 427/569 |

OTHER PUBLICATIONS

Haller et al., "Electrical Resistivity of CuCo Solid Solutions at Low Temperature", 1981, phys. stat. sol. (a) 68, 135.*

* cited by examiner

*Primary Examiner* — Charles D Garber
*Assistant Examiner* — Xiaoming Liu
(74) *Attorney, Agent, or Firm* — Fish & Richardson P.C.

(57) ABSTRACT

An integrated circuit is fabricated by chemical vapor deposition or atomic layer deposition of a metal film to metal film.

22 Claims, 1 Drawing Sheet

MICROWAVE ANNEAL TO IMPROVE CVD METAL GAP-FILL AND THROUGHPUT

BACKGROUND

Technical Field

Embodiments described herein generally relate to the field of semiconductor manufacturing processes, more particularly, to methods for depositing a contact metal layer in contact structures of a semiconductor device.

Background Discussion

Reliably producing sub-hundred nanometer and smaller features in fast high volume production is one of the key technologies for the next generation of very large scale integration (VLSI) and ultra large-scale integration (ULSI) of semiconductor devices. Interconnect conductors ("wires") are formed in small trenches in insulating layers. As the limits of integrated circuit technology are pushed, the shrinking dimensions of interconnects in VLSI and ULSI technology have placed additional demands on processing capabilities, leading to challenges in performing metal gap-fill. Chemical vapor deposition (CVD) and/or atomic layer deposition (ALD) of metals appears to be feasible for gap-fill in trenches with small geometries. However, due to (a) organic compounds present in the CVD metal precursor gases and (b) small grain size in the deposited metal, the process usually requires intensive treatments and annealing to eliminate seams and voids, and to grow larger grains to complete gap-fill and achieve lowest possible resistivity. As one example, cobalt CVD process is one promising approach for gap-fill. However, this process requires forming successive nano-layers of cobalt in repetitive cycles of plasma treatment and reactive gas soak, and post-deposition annealing, for smooth film, impurity reduction, and grain growth sufficient to complete gap-fill.

In conventional processes, the metal (e.g., cobalt) is deposited in many repetitive steps, one thin layer (e.g., 2-10 nanometers thick) being deposited in each step. In each step, the deposition of the thin metal layer is followed by a plasma treatment to remove impurities from the deposited metal film. Each step (i.e., the CVD of a thin cobalt layer followed by a plasma treatment) is repeated until a desired metal thickness has accumulated. Depending upon the deposition thickness of each step, the process may take as long as 10-20 minutes per wafer. Therefore, the throughput is severely limited by the necessary treatments in process. This limits the usefulness of cobalt CVD as a cost effective solution for high volume manufacturing. Conventional methods to incrementally improve the throughput include more intensive treatments with a smaller number of cycles, and longer time post-deposition annealing. Such methods are limited by trade-offs in gap-fill and final cobalt (wire) conductivity. The problem is that microvoids start forming in the cobalt layer due to less effective treatments and due to more impurities leftover inside the deposited metal, leading to smaller grain size. For example, trying to save time by reducing the number of repetitive deposition cycles necessarily increases the deposited thickness in each cycle. Resistivity of the deposited cobalt increases as the thickness per cycle increases. For example, for a 20 nm trench, increasing deposition thickness per cycle from 2 nm to 10 nm can increase the resistivity from about 60 microOhm-cm to 120 microOhm-cm. What is desired is lower resistivity and a larger grain size in the deposited metal approaching the width of the trench in which the metal is deposited.

A further limitation is that the temperature of the underlying integrated circuit layers cannot exceed 400 degrees Celsius without exceeding a thermal budget imposed to preserve interconnect integrity. This limits the rate at which the thermal anneal process can heal surface roughness, microvoids, cracks and other imperfections in the deposited metal and increase grain size.

SUMMARY

A method of forming a metal conductor in an integrated circuit comprises: forming an underlayer and forming a trench in the underlayer, depositing a metal film on the underlayer of a film thickness corresponding to a depth of the trench by performing a single deposition operation, and annealing the metal film with microwave radiation.

In an embodiment, the annealing comprises increasing grain size in the metal film to at least nearly a width dimension of the trench.

In an embodiment, the annealing comprises reducing resistivity of the metal film to less than about 30 microOhm-cm.

In an embodiment, the film thickness is sufficient to fill the depth of the trench.

In an embodiment, the depositing a metal film on the underlayer comprises performing a chemical vapor deposition (CVD) and/or atomic-layer deposition (ALD) operation.

In an embodiment, the CVD/ALD operation comprises exposing the metal film to an organic gas precursor of cobalt.

In an embodiment, the CVD operation further comprises exposing the metal film to hydrogen.

In an embodiment, the microwave annealing heats the metal film locally to over 400 degrees C.

In an embodiment, the method further comprises heating or cooling the underlayer through a workpiece support during the microwave annealing.

In an embodiment, the method further comprises cooling the underlayer through a workpiece support during the microwave annealing.

In an embodiment, the method further comprises cooling the underlayer to a temperature less than 400 degrees C. through a workpiece support during the microwave annealing.

In a further aspect, a method of forming a metal conductor comprises depositing a metal film on a substrate layer by performing a single deposition operation, and annealing the metal film with microwave radiation.

In an embodiment, the annealing comprises reducing resistivity of the metal film to less than about 30 microOhm-cm.

In an embodiment, the depositing a metal film on the underlayer comprises performing a chemical vapor deposition (CVD) operation.

In an embodiment, the CVD operation comprises exposing the metal film to an organic gas precursor of cobalt.

In an embodiment, the CVD operation further comprises exposing the metal film to hydrogen.

In an embodiment, the microwave annealing heats the metal film to over 400 degrees C.

One embodiment further comprises heating or cooling the underlayer through a workpiece support during the microwave annealing.

In a yet further aspect, a method of forming a metal interconnect comprises forming a metal film by chemical vapor deposition and/or atomic layer deposition, and annealing the metal film by exposing the metal film to microwave radiation.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

According to one embodiment, microwave anneal is performed to replace the cyclic plasma treatments and thermal annealing required in conventional processes. This change dramatically improves the production throughput by a factor of 2-5, while providing low resistivity interconnects meeting or exceeding the performance of conventionally fabricated interconnects. The microwave anneal efficiently drives out film impurities in the metal film and boosts gap fill performance. This eliminates the need for deposition of successive thin layers of metal. Instead, a single CVD or ALD process is performed in which the final thickness is deposited in a single operation. The microwave anneal thoroughly removes imperfections in the metal layer quickly. Unlike the conventional pedestal heating, where the annealing energy was absorbed through bulk heating, microwave anneal takes advantage of the responsiveness of deposited CVD metals to heating by microwaves to grow grains while purifying the deposited metal film.

The microwave energy heats the deposited metal film to a higher temperature than the bulk silicon or the underlying layers of the integrated circuit components. Therefore, the process raises the deposited metal film to a higher temperature (e.g., 500-800 degrees Celsius) than the bulk silicon or underlying layers, while leaving the underlying layers (e.g., the bulk silicon) at or below the temperature limit (e.g., 400 degrees C.) of the thermal budget. The higher temperature of the deposited metal film reduces the time needed to perform the microwave anneal operation (e.g., down to 30 second in some cases).

Figure 1:
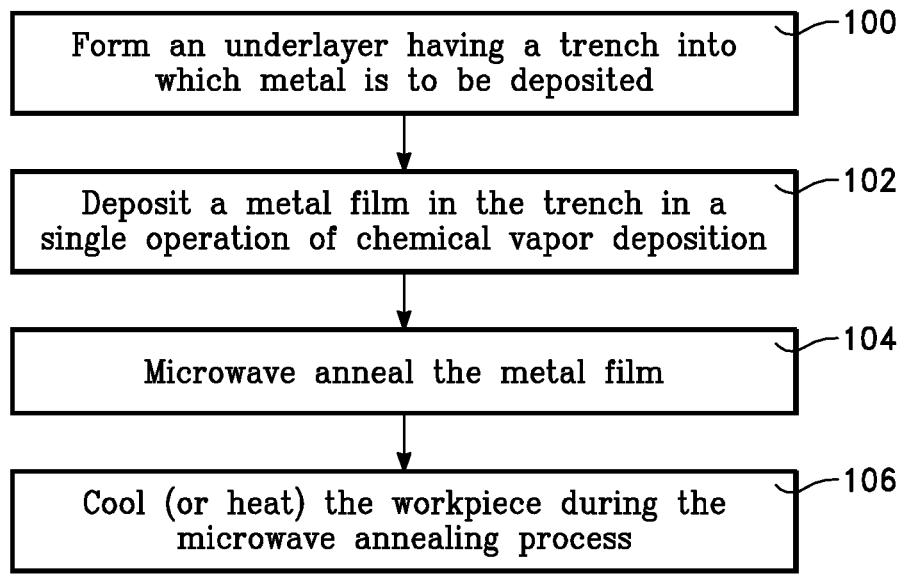
FIG. 1 is a block flow diagram of a process in accordance with one embodiment.
Figure 2:
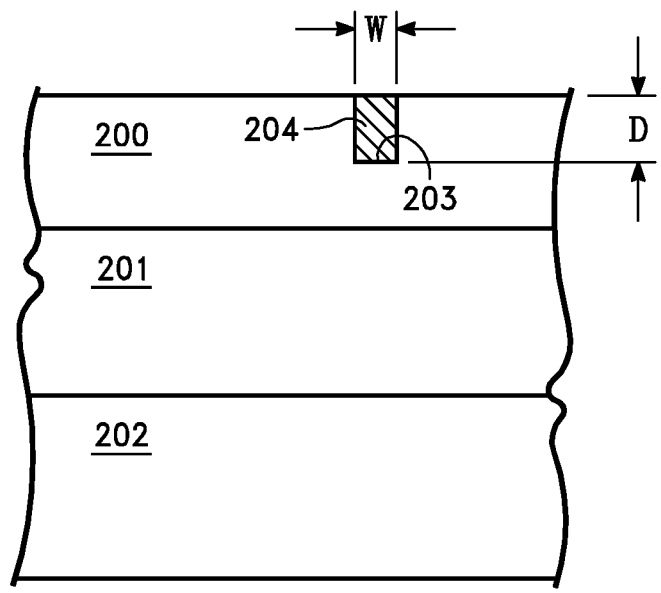
FIG. 2 is a simplified cross-sectional view of a structure formed in the process of FIG. 1.

Referring to FIG. 1, one embodiment of the process begins with formation of an underlayer onto which metal is to be deposited (block 100 of FIG. 1). As shown in FIG. 2, the underlayer may be an insulating layer 200 on a workpiece 201 supported on a workpiece support 202 in a reactor chamber. A conductor-receiving feature such as an elongate trench 203 is formed in the insulating layer 200. The trench 203 may have a depth D of (for example) 80 nm and a width W of (for example) 20 nm.

The process of FIG. 1 continues with deposition of a metal film, e.g., a cobalt film by chemical vapor deposition (block 102 of FIG. 1). As shown in FIG. 2, the deposited metal film 204 has a thickness which is at least nearly equal to the depth D of the trench 203 and fills (or nearly fills) the trench 203. The metal film 204 in the trench 203 may serve as an interconnect conductor. Only a single CVD operation is needed to form the metal film 204. The CVD operation may be performed by immersing the workpiece 201 in a process gas including a precursor of the metal to be deposited. Hydrogen gas may be included in the process gas.

The process of FIG. 1 further continues with microwave annealing of the metal film 204 (block 104 of FIG. 1), which can reduce resistivity to about 20-30 microOhm-cm in the metal film 204. In one embodiment, the microwave power is set to a level at which the metal film 204 is heated to a temperature of over 400 degrees C., while heating the bulk of the workpiece up to but not exceeding 400 degrees C.

In the cobalt CVD process of block 102, suitable cobalt precursors for forming cobalt-containing materials (e.g., metallic cobalt or cobalt alloys) by CVD processes described herein include but are not limited to the following: cobalt carbonyl complexes, cobalt amidinates compounds, cobaltocene compounds, cobalt dienyl complexes, cobalt nitrosyl complexes, derivatives thereof, complexes thereof, plasmas thereof, or combinations thereof. The organic components of the cobalt precursor gases are impurities in the metal film and are removed by the microwave anneal operation.

In one embodiment, the process of FIG. 1 may further include heating or cooling the workpiece 201 through the workpiece support 202 (block 106 of FIG. 1) simultaneously with the microwave anneal operation of block 104.

Process conditions may be as follows: Hydrogen based gas-phase ambient with 5-100% H2 diluted by inert gas, pressure range of 100-700 Torr, microwave power in a range of 1-20 kW, at a microwave frequency of 1-20 GHz. The microwave power can be pulsed with 100-10 kHz pulse frequency with various duty cycles.

Process conditions may be limited in some cases as follows: microwave power in a range of 1-8 kW; workpiece height within elevation range of the lift servo; workpiece cooled through the workpiece support to a desired temperature (e.g., at or below 400 degrees C.); pressure in a range of 200-700 Torr; hydrogen gas flow mixed with inert gas during CVD operation and during microwave anneal in a range of 10%-100% hydrogen.

The foregoing process including microwave anneal has demonstrated equivalent CVD cobalt sheet resistance (as an indicator of film purity and grain growth) equivalent to that of conventionally treated and annealed film, but with a factor of 2-5 throughput improvement. By tuning microwave process regimes, complete gap-fill and damage-free processing can be achieved. The process of metal CVD deposition and microwave anneal can be broadly used to heal seams, voids, and increase grain sizes for lower resistivity for gap-fill in CVD metals.

The foregoing process may be altered by performing atomic layer deposition instead of chemical vapor deposition.

Advantages:

Microwave anneal is performed to replace the cyclic plasma treatments and thermal annealing required in conventional processes. This change dramatically improves the production through-put by a factor of 2-5, while providing low resistivity interconnects meeting the performance of conventionally fabricated interconnects. The microwave anneal efficiently drives out film impurities in the metal film and boosts gap fill performance. This eliminates the need for deposition of successive thin layers of metal. Instead, a single CVD or ALD process is performed in which the final thickness is deposited in a single operation.

While the foregoing is directed to embodiments of the invention, other and further embodiments of the invention may be devised without departing from the basic scope thereof, and the scope thereof is determined by the claims that follow.

What is claimed is:

1. A method of forming metal conductors in an integrated circuit, comprising:
    forming an underlayer and forming a trench in said underlayer;
    depositing an unalloyed cobalt metal film on said underlayer of a film thickness corresponding to a depth of said trench by performing a single chemical vapor deposition (CVD) operation such that the metal film substantially fills the trench, wherein the single CVD operation deposits a film with at least 80 nm depth; and
    annealing said metal film with microwave radiation, wherein said microwave radiation is absorbed by said metal film to heat said metal film to a temperature sufficient to cause a resistivity of said metal film to decrease after the annealing and not cause the said metal film to melt, so that resistivity of the metal film reduces to below 30 microOhm-cm.

2. The method of claim 1 wherein said annealing comprises increasing grain size in said metal film to at least nearly a width dimension of said trench.

3. The method of claim 1 wherein said film thickness equals said depth of said trench.

4. The method of claim 1 wherein said CVD operation comprises exposing said metal film to an organic gas precursor of cobalt.

5. The method of claim 4 wherein said CVD operation comprises exposing said metal film to hydrogen.

6. The method of claim 1 wherein said microwave radiation heats said metal film to over 400 degrees C.

7. The method of claim 1 further comprising heating or cooling said underlayer through a workpiece support during said microwave annealing.

8. The method of claim 7 further comprising cooling said underlayer through said workpiece support to cause said underlayer have a temperature less than temperature of said metal film during said microwave radiation.

9. The method of claim 8 further comprising cooling said underlayer to a temperature less than 400 degrees C. through a workpiece support during said microwave annealing.

10. The method of claim 1, wherein annealing the metal film removes impurities that were deposited on the metal film during the CVD operation without performing a cyclic thermal or plasma treatment of the metal film.

11. The method of claim 1, wherein the microwave radiation is powered by a pulsed power with pulse frequency between 100 to 10 kHz.

12. The method of claim 1, wherein the reducing gas comprises hydrogen.

13. A method of forming metal conductor, comprising:
    depositing an unalloyed cobalt metal film on a substrate layer of a workpiece by performing a single chemical vapor deposition (CVD) operation, wherein the CVD operation comprises exposing said workpiece to an organic gas precursor of cobalt to form said unalloyed cobalt metal film; and
    annealing said metal film with microwave radiation and under a pressure of 100-700 Torr, wherein said microwave radiation is absorbed by said metal film to heat said metal film to a temperature sufficient to cause a resistivity of said metal film to decrease after the annealing and not cause the said metal film to melt,
    wherein annealing the metal film removes impurities that were deposited on the metal film during the CVD operation without performing a cyclic thermal or plasma treatment of the metal film.

14. The method of claim 13 wherein said annealing comprises reducing resistivity of said metal film to less than about 30 microOhm-cm.

15. The method of claim 13 wherein said CVD operation comprises exposing said workpiece to hydrogen.

16. The method of claim 13 wherein said microwave radiation heats said metal film to over 400 degrees C.

17. The method of claim 13 further comprising heating or cooling said underlayer through a workpiece support during said annealing.

18. The method of claim 13 further comprising cooling said underlayer to a temperature less than 400 degrees C. through the workpiece support during said microwave radiation.

19. The method of claim 13, wherein the metal film has a depth of at least 80 nm.

20. The method of claim 13, wherein the workpiece is annealed while being at a gas-phase ambient comprising the reducing gas and an inert gas.

21. The method of claim 20, wherein the gas-phase ambient has at least 5% and less than 100% hydrogen.

22. A method of forming metal conductors in an integrated circuit, comprising:
    forming an underlayer;
    depositing a metal film on said underlayer by performing atomic layer deposition; and
    annealing said metal film with microwave radiation in presence of a reducing gas and under a pressure of 100-700 Torr, wherein said microwave radiation is absorbed by said metal film to heat said metal film to a temperature sufficient to cause a resistivity of said metal film to decrease after the annealing and not cause the said metal film to melt,
    wherein annealing the metal film removes impurities that were deposited on the metal film during the atomic layer deposition operation without performing a cyclic thermal or plasma treatment of the metal film.

\* \* \* \* \*

UNITED STATES PATENT AND TRADEMARK OFFICE
CERTIFICATE OF CORRECTION

PATENT NO. : 10,438,849 B2  
APPLICATION NO. : 15/137245  
DATED : October 8, 2019  
INVENTOR(S) : He Ren et al.

Page 1 of 1

It is certified that error appears in the above-identified patent and that said Letters Patent is hereby corrected as shown below:

In the Claims

Column 6, Line 27, in Claim 17, delete "underlayer" and insert -- substrate layer -- therefor.

Column 6, Line 29, in Claim 18, delete "claim 13" and insert -- claim 17 -- therefor.

Signed and Sealed this  
Seventeenth Day of March, 2020

Andrei Iancu  
*Director of the United States Patent and Trademark Office*